United States Patent
Oppermann et al.

[11] Patent Number: 5,976,302
[45] Date of Patent: Nov. 2, 1999

[54] METHOD OF JOINING ELECTRONIC COMPONENTS TO A SUBSTRATE

[75] Inventors: Hans Hermann Oppermann, Berlin; Elke Zakel, Falkensee; Christine Kallmayer; Achim Kloeser, both of Berlin, all of Germany

[73] Assignee: Fraunhofer-Gesellschaft zur Förderung der angewandten Forschung e.V., Munich, Germany

[21] Appl. No.: 08/860,311
[22] PCT Filed: Dec. 23, 1995
[86] PCT No.: PCT/DE95/01871
 § 371 Date: Nov. 7, 1997
 § 102(e) Date: Nov. 7, 1997
[87] PCT Pub. No.: WO96/24951
 PCT Pub. Date: Aug. 15, 1996

[30] Foreign Application Priority Data

Feb. 10, 1995 [DE] Germany ............... 195 04 351

[51] Int. Cl.⁶ .............. B32B 31/00; H05K 3/30
[52] U.S. Cl. .............. 156/299; 29/832; 29/840; 228/175; 228/180.22
[58] Field of Search ................. 228/175, 135, 228/180.22, 207, 223, 224; 29/424, 832, 840; 156/60, 292, 314, 318, 299

[56] References Cited

U.S. PATENT DOCUMENTS

| | | | |
|---|---|---|---|
| 3,765,938 | 10/1973 | Cranston | 29/832 X |
| 3,869,787 | 3/1975 | Umbaugh | 156/60 X |
| 4,340,167 | 7/1982 | Packer et al. | 228/180.1 |
| 5,075,253 | 12/1991 | Sliwa, Jr. | 29/832 X |

OTHER PUBLICATIONS

IBM Technical Disclosure Bulletin, "Flip Chip Substrate Joining Process", Apr. 1970, US, vol. 12, No. 11, pp. 1–2.

Primary Examiner—Michael W. Ball
Assistant Examiner—Shawn A. Mitchell
Attorney, Agent, or Firm—Darby & Darby

[57] ABSTRACT

A method for the temporary fixing of an electronic component (10) having elevated contact metallizations (11) to a substrate (17) provided with terminal surfaces (16) for a subsequent thermal connection of the contact metallizations to the terminal surfaces, wherein a bonding agent is applied to the component and/or the substrate and wherein the bonding agent used is an alcoholic liquid medium containing an alcohol (13) whose surface tension is used to form bonding forces between the contact metallizations and the terminal surfaces and whose boiling point is below the melting temperature of the contact metallizations (11).

7 Claims, 1 Drawing Sheet

METHOD OF JOINING ELECTRONIC COMPONENTS TO A SUBSTRATE

The present invention relates to a method for the temporary fixing of an electronic component having elevated contact metallizations on a substrate provided with terminal surfaces for a subsequent thermal connection of the contact metallizations to the terminal surfaces, wherein a bonding agent is applied to the component and/or the substrate.

Methods of the type referred to in the introduction are used for example in order to obtain a detachable mechanical preliminary fixing in so-called flip-chip contacting. In this contacting method the chip is applied to the terminal surfaces of a substrate with its elevated contact metallizations, also referred to as bumps, facing downwards. The actual connection between the chip and the substrate is then produced by subjecting the bumps to thermal energy whereby a remelting of the bumps occurs. To fix the relative positioning between the chip and the substrate prior to the remelting, it is known to provide an application of fluxing agent between the bumps and the terminal surfaces, which fluxing agent establishes a bond between the chip and the substrate for such time as the bumps have not yet melted. When the bumps are in the molten state, the fixing action of the fluxing agent ceases and therefore the chip is mounted on the substrate in quasi-floating fashion. Here a self-aligning method can occur which is brought about by the surface tension of the contact metallization material and which provides for an exact positioning of the chip on the substrate.

In the above described method for temporary fixing, this advantageous exploitation of the self-aligning effect is acquired together with the disadvantage that anionic or cationic fluxing agent residues remain on the remelted bumps even after the formation of the connection between the chip and the substrate. This frequently has a disadvantageous effect on the reliability of the provided connection.

Another known method for temporary fixing consists in that, before the production of the final connection between chip and substrate, a pressure welding connection is effected between the chip bumps and the substrate terminal surfaces, said pressure welding connection being released again when the subsequent thermal connection is established, whereby here again the advantageous self-aligning effect is facilitated. However, the high mechanical stress upon the chip associated with the pressure welding proves disadvantageous as in this method relatively high reject quotas due to mechanical damage to the chips are noted.

Therefore the object of the present invention is to propose a method which facilitates a temporary fixing of electronic components, such as for example chips, on a substrate without entailing the disadvantageous accompanying phenomena described in the foregoing.

This object is fulfilled by a method comprising the features of claim 1.

In the method according to the invention, the bonding agent selected is an alcoholic liquid medium containing an alcohol whose surface tension is used to form bonding forces between the contact metallizations and the terminal surfaces and whose boiling point is below the remelting temperature of the contact metallization.

When an alcoholic medium of this kind is employed, which can be applied to part of or all of the surface of the substrate or component, use is made of the property of many alcohols of forming—by virtue of their high interfacial or surface tensions—correspondingly high surface forces in the contact region between contact metallization and terminal surface, these resulting in high bonding forces. Use is also made of the advantageous property of alcohol of evaporating with no residue so that, in contrast to the methods employing conventional fluxing agents, no anionic or cationic residues, which disadvantageously influence the reliability of the connection, remain on the remelted contact metallizations. The setting of the boiling point below the remelting temperature of the contact metallization ensures that on the one hand the bonding forces are effective until the remelting of the contact metallization and on the other hand after the remelting of the contact metallization the alcohol used as bonding agent is eliminated without residue.

The method according to the invention naturally can also be applied advantageously when the elevated contact metallizations are arranged on the substrate or are arranged both on the component and on the substrate.

In accordance with a preferred variant of the method, the bonding agent is applied only to the elevated contact metallizations, which facilitates a specially dosed use of the bonding agent and also obviates the need for possibly required cleaning of any bonding agent residues from the remaining surface of the electronic component and/or substrate after the production of the thermal connection.

In accordance with claim 3, the method can be employed in the case of so-called face-down contacting of the component. Such contacting is carried out for example in the known flip-chip contacting method. If the bonding agent is applied for this purpose to the contact metallization, the method can be carried out without special preliminary treatment of the substrate terminal surfaces.

The alcohols which have sufficient surface tensions to form the bonding forces between the contact metallizations and the terminal surfaces are generally alcohols which have long molecular chains and therefore tend to be high-boiling and possess a relatively high viscosity. Therefore it proves particularly advantageous if, in addition to a relatively high-boiling alcohol for the formation of the above explained bonding forces between the contact metallizations of the component and the terminal surfaces of the substrate, the bonding agent also contains a solvent in order to permit the application of the bonding agent in a particularly thin layer.

If a relatively low-boiling alcohol is used as solvent or diluent, it is ensured that the inert effect of the alcohol is not negatively affected by the addition of the solvent.

Relatively high-boiling alcohols, such as glycol, glycerol, pyrolydol or other alcohols having a correspondingly high interfacial tension prove particularly suitable for use in the method according to the invention.

Relatively low-boiling alcohols, such as methanol, isopropanol or other alcohols having a correspondingly low interfacial tension and low boiling point prove particularly suitable for use as solvent in the method according to the invention.

In the following the method will be explained in detail in the form of a method variant, which is to be considered as an example, making reference to the drawings wherein.

Figure 1:
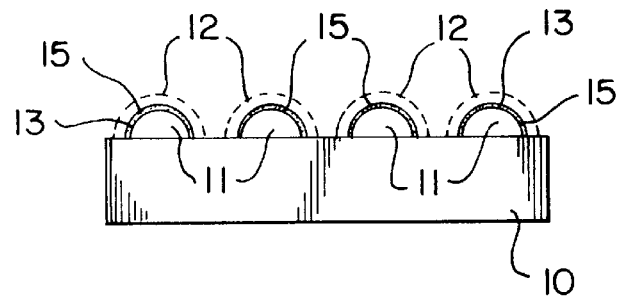
FIG. 1 illustrates a chip whose surface is provided with a bonding agent.

FIG. 1 shows a chip 10 with a plurality of elevated contact metallizations 11 referred to as so-called bumps. The contact metallizations 11 are provided with a bonding agent solution 12 consisting of high-boiling alcohol 13 with long molecular chains and low-boiling alcohol 14, which solution can be applied for example in drop form to the contact metallizations 11.

The film-like coating 15 in FIG. 1, formed from the high-boiling alcohol 13, on the contact metallizations 11 remains behind when the low-boiling alcohol 14 serving as solvent has evaporated at room temperature.

The contact metallizations 11 shown in FIG. 1 can be formed for example from an eutectic gold/tin alloy having a solidification temperature of 278° C. Glycerol, with a boiling point of 286° C., is a suitable choice for the high-boiling alcohol 13 which remains on the contact metallizations 11 as coating 15 after the evaporation of the solvent. Methanol is suitable for use as solvent.

Figure 2:
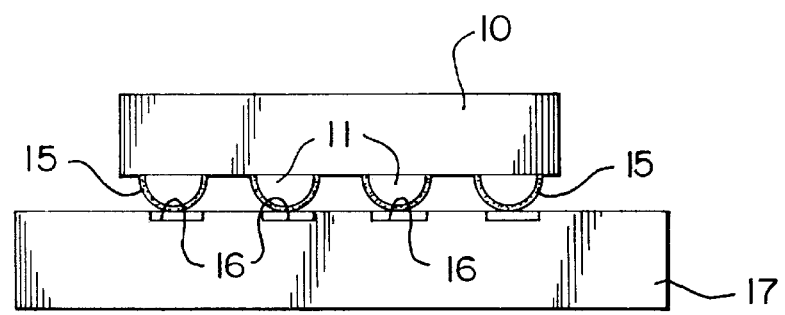
FIG. 2 illustrates the application of the chip shown in FIG. 1 to a substrate in the flip-chip method.

As shown in FIG. 2, for contacting on a substrate 17 provided with terminal surfaces 16, the chip 10 is applied to the terminal surfaces 16 of the substrate 17 with the contact metallizations 11 facing downwards, as customary in the flip-chip method. The drying of the coating 15 gives rise to surface forces which produce a fixing bond between the chip 10 or the contact metallizations 11 and the substrate 17 or the terminal surfaces 16.

Figure 3:
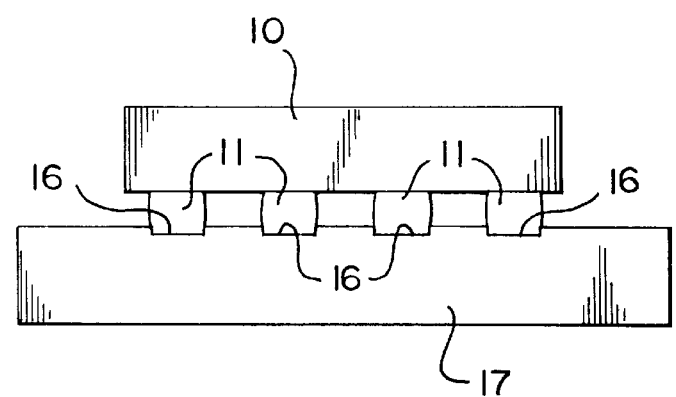
FIG. 3 illustrates the remelting of the chip bumps for connection to terminal surfaces of the substrate.

After the formation of the bonding forces between the contact metallizations 11 and the terminal surfaces 16, the contact metallizations 11 are heated, for example by subjecting the contact metallizations to infrared radiation, to a temperature of approximately 300° C., which leads to a remelting of the contact metallizations 11, as shown in FIG. 3. Before or when the remelting temperature of the contact metallization 11 is reached, the coating 15 shown in FIG. 2 evaporates. Therefore the chip 10 can automatically and unobstructedly align itself via the surface forces active in the molten contact metallizations 11, the relative position now reached by the chip being as it were frozen upon the solidification of the remelted contact metallizations. As the coating 15 evaporates at the latest when the contact metallizations 11 assume the molten state, in contrast to conventional fixing using a fluxing agent the surface of the contact metallization 11 is free of any residues of the bonding agent after the solidification.

The following may also be mentioned as further examples of suitable combinations of contact metallizations and high-boiling alcohols: glycol (boiling point 197° C.) in the case of a eutectic tin/lead alloy (Sn/Pb 63/37, solidification temperature 183° C.) and pyrolydol and glycerol in the case of contact metallizations with a high lead content.

We claim:

1. A method for temporarily affixing an electronic component having elevated contact metallizations to a substrate provided with terminal surfaces, for a subsequent thermal connection of the contact metallizations to the terminal surfaces, said method comprising the steps of applying to the terminal surfaces a mixture comprising an alcohol having a high boiling point and an alcohol having a low boiling point;

contacting the contact metallizations with the terminal surfaces;

evaporating from the mixture the alcohol having a low boiling point and forming a bonding coating from the alcohol having a high boiling point and affixing the elevated contact metallizations of the electronic component to the terminal surfaces of the substrate with the bonding coating.

2. A method for temporarily affixing an electronic component having elevated contact metallizations to a substrate provided with terminal surfaces, for a subsequent thermal connection of the contact metallizations to the terminal surfaces, said method comprising the steps of applying to the elevated contact metallizations a mixture comprising an alcohol having a high boiling point and an alcohol having a low boiling point;

contacting the contact metallizations with the terminal surfaces;

evaporating from the mixture the alcohol having a low boiling point and forming a bonding coating from the alcohol having a high boiling point and affixing the elevated contact metallizations of the electronic component to the terminal surfaces of the substrate with the bonding coating.

3. The method according to claim 2, wherein the contacting step is accomplished by positioning the electronic component above the substrate with the elevated contact metallizations of the electronic component facing downward and wherein the mixture comprising an alcohol having a high boiling point and an alcohol having a low boiling point is applied in the facing downward position.

4. The method according to claim 1, wherein the mixture of the application step also includes a solvent.

5. The method according to claim 4, wherein the solvent is a second alcohol having a low boiling point.

6. The method according to claim 3, wherein the alcohol having a high boiling point is selected from the group consisting of glycol, glycerol, and pyrolydol.

7. The method according to claim 3, wherein the alcohol having a low boiling point is selected from the group consisting of methanol and isopropanol.

* * * * *